United States Patent
Ritz et al.

(10) Patent No.: US 6,628,002 B2
(45) Date of Patent: Sep. 30, 2003

(54) HEAT TRANSFER SYSTEM WITH SUPRACRITICAL FLUID

(75) Inventors: Charles Louis Ritz, Fullerton, CA (US); George David Margolin, Newport Beach, CA (US)

(73) Assignee: Margolin Development, Newport Beach, CA (US)

( * ) Notice: Subject to any disclaimer, the term of this patent is extended or adjusted under 35 U.S.C. 154(b) by 14 days.

(21) Appl. No.: 09/969,252

(22) Filed: Oct. 2, 2001

(65) Prior Publication Data

US 2003/0062619 A1 Apr. 3, 2003

(51) Int. Cl.[7] .............................................. H01L 23/48

(52) U.S. Cl. ...................... 257/930; 257/712; 257/714

(58) Field of Search ................................ 257/706, 707, 257/712, 714, 716, 930; 361/689, 691, 692

(56) References Cited

U.S. PATENT DOCUMENTS

| | | | |
|---|---|---|---|
| 5,959,351 A | 9/1999 | Sasaki et al. | 257/714 |
| 6,124,632 A | 9/2000 | Lo et al. | 257/678 |
| 6,164,076 A | * 12/2000 | Chu et al. | 62/3.7 |

* cited by examiner

Primary Examiner—Kamand Cuneo
Assistant Examiner—L. Cruz

(57) ABSTRACT

A heat removal system for integrated circuit chips, lasers, portable electronic devices, and the like which produce destructive amounts of heat employs a device which delivers working fluid to a high heat flux surface in a manner to avoid any change in phase of the fluid. The invention is based on the recognition that the heat flux produced by such sources is so high that prior art heat sinks fail to remove heat at a sufficient rate from a high heat flux surface and become inefficient in removing heat. The fluid here is maintained at a pressure and pumped at a rate to provide a sufficiently short dwell time to maintain the fluid in a supracritical state thus avoiding vapor lock. The fluid also may be cooled by, for example, either an evaporative or an absorption chiller driven by the heat from the heat source or by a thermoelectric cooler.

18 Claims, 5 Drawing Sheets

HEAT TRANSFER SYSTEM WITH SUPRACRITICAL FLUID

BACKGROUND OF THE INVENTION

It is well known in the art that electronic equipment such as semiconductor chips, portable digital assistants (PDAs), personal computers (PCs), etc., generate increasing amounts of heat as the density of components increases and/or the size of the device becomes smaller. The thermal management problem is becoming most urgent and is receiving increasing attention in the field.

All sorts of cooling implementations are being advanced to assist in the regulation of temperature for such devices particularly those subject to high heat flux. Current prior art efforts have reached a limiting point at which electronic devices can generate heat at a faster rate than can be transmitted through the enveloping surfaces. Current prior art devices include heat pipes, diamond substrates, circulating fluid heat sinks, and many others which may be subject to a heat flux as much as 1,000,000 W per $m^2$. Unfortunately, no system has yet been offered which sufficiently regulates temperature of, for example, semiconductor integrated circuit chips. Instead, control circuits are often provided to sense temperature and to reduce operating speeds to maintain temperatures within acceptable limits. The design and specification of the size, operational level and speed for portable devices and other high flux generating devices is constrained by thermal effects. Accordingly, a significant problem faced by manufacturers of portable electronic equipment and/or densely packed equipment is temperature regulation and subsequent heat removal.

BRIEF DESCRIPTION OF THE INVENTION

In accordance with the principles of this invention, thermal regulation and heat removal from, for example, an electronic heat source, is greatly enhanced by moving small amounts of fluid past the hot spots at a rate and at a pressure sufficient to insure that no change of phase occurs within the fluid. Regulation of temperature and heat transfer for systems generating a heat flux in excess of 1,000,000 W per $m^2$ and up to 10,000,000 W. per $m^2$ can be realized. One of the major aspects of the invention is based on the recognition that only a supracritical fluid, at a sufficiently high mass flux, would be effective in transfer and removal of heat from such an electronic source. That is because such a source produces such an extremely high flux condition that prior fluid heat removal systems experience some form of flow restriction akin to vapor lock and thus fail to consistently remove heat at a sufficient rate. The reason for this is that these prior art heat removal systems have working fluids which either wholly or partially vaporize and thereby may cause catastrophic failure of the system. Also, these prior art heat removal systems lack a device designed for a heat source which produces the kind of high heat flux condition currently being developed and thus fail to remove heat at a sufficient rate to ensure proper operating temperature regulation. Thus the invention comprises devices which allow supracritical state working fluids to efficiently and effectively regulate the transfer of heat to or from a high heat flux surface.

In a first embodiment, supracritical fluid is circulated through a device consisting of pathways for the working fluid which allow for the direct impingement of the working fluid upon the high heat flux surface. The device allows for sufficient mass flux, very brief residence time of the working fluid on the hot surface, and continuous, rapid fluid replacement for constant heat removal.

In a second embodiment, a porous heat sponge made of, for example, POCOFOAM™ or sintered graphite is included against the heat generating surface. This device circulates a supracritical fluid, for example $CO_2$ above its critical pressure of 1071 psia, and in such a manner that the mass flux through the porous sponge is sufficient to efficiently and effectively assist in the transfer of heat to a relatively low heat flux area from a high heat flux-surface. Research literature indicates that a mass flux greater than 500 kg per sec-$m^2$ is needed.

A third embodiment includes such a device as in embodiment one along with the structural sponge envisioned for embodiment two. These items, connected either in series or in parallel, constitute a system wherein pure supracritical working fluid circulates in contact with surfaces of high to very high heat flux (1,000,000 W per $m^2$ to 10,000,000 W per $m^2$ or a combination of supracritical and subcritical working fluid. This embodiment has the ability to take advantage of any cooling arising from the evolution of a gas phase below the critical pressure in a selected parts of the system.

In all embodiments, the constraints imposed by high flux conditions are overcome and heat removal proceeds at rates unrealized by prior art heat removal and thermal regulation systems. Also the flow of working fluid through the devices envisioned in embodiments 1 through 3, is actively controlled in such a manner so as to maintain required levels of mass flux, temperature and pressure anywhere within the system.

Supracritical working fluid at a sufficient mass flux is required for proper functioning of the devices envisioned in all embodiments herein when heat is to be removed from a surface that generates a high heat flux (1,000,000 W per $m^2$ to 10,000,000 W per $m^2$). When the working fluid is in a supracritical state (herein meaning above the critical pressure and/or at the critical pressure of the working fluid), there is no opportunity for the fluid to form a vapor/liquid interface (vapor lock) which would greatly lower the ability of the high heat flux surface to transfer heat to the adjacent flowing work fluid. It is the formation of vapor lock at the vapor/liquid interface on or near the surfaces generating or receiving high heat flux, that can cause catastrophic failure of the system. More specifically, when the working fluid is in a supracritical state (herein meaning at/above/or below the critical temperature and above the critical pressure and/or at the critical pressure of the working fluid) there is no opportunity for the fluid to form a vapor-liquid interface (vapor lock) which could block further fluid flow or heat transfer.

An additional benefit of having supracritical working fluid occurs if the system is at or very near the critical temperature. At this condition, the enthalpy of the working fluid is enhanced due to the physical properties of the supracritical working fluid. Enthalpy as a function of temperature with the pressure constant shows a distinct jump from its normal monotonic rise. This notch arises from the natural evolution of the supracritical working fluid's density from a dense to a highly less dense state that occurs as the temperature rises within several degrees of the critical temperature. For example, $CO_2$ has a critical pressure of 7.39 MPa and a critical temperature of 31.1 C. At a pressure of 7.5 Mpa and between 25 C. and 40 C., $CO_2$ there is a enthalpy difference of 154 kilojoules per kilogram $CO_2$. Whereas between −25 C. and 25 C. the difference in enthalpy is 121 kilojoules per kilogram $CO_2$ and between 40 C. and 90 C. the difference in enthalpy is 91 kilojoules per kilogram $CO_2$. Thus within a small temperature range from 25 C. to 40 C. the ability of the working fluid to hold and transmit heat is greatly enhanced.

In still further embodiments, any one of the above embodiments is coupled with a cooling system comprising a novel arrangement of concentric cylindrical, (thermoelectric) coolers with the (interstitial) spacings between the coolers filled with porous heat sponge material through which supracritical fluid can be circulated.

The various embodiments herein are effective to maintain electronic devices at a preset temperature and avoid the dangers of destructive thermal runaway without the necessity of reducing operating speed and/or power input or output.

DETAILED DESCRIPTION OF ILLUSTRATIVE EMBODIMENTS OF THIS INVENTION

Figure 1:
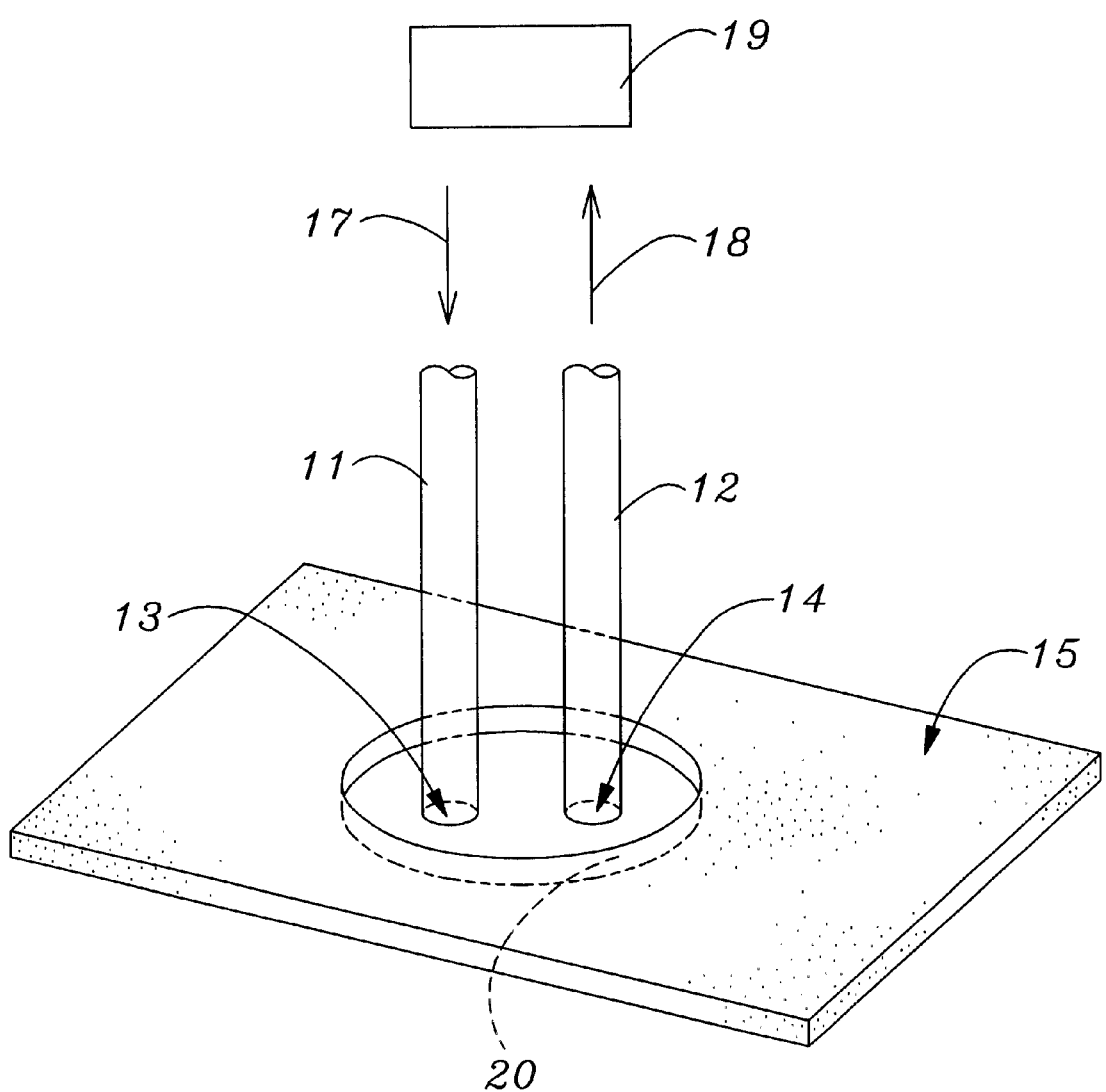
FIG. 1 is a schematic representation of a portion of a heat transfer and cooling system in accordance with this invention.

FIG. 1 shows a schematic illustration of the principles of this invention. The figure shows first and second tubes 11 and 12 arranged vertically as viewed. The tubes have lower ends 13 and 14, respectively, which are closely spaced from a surface 15. Surface 15 represents a hot surface such as the surface of an integrated circuit chip which generates heat during operation. Surface 15 also may be taken to represent a laser emitting surface or the heat generating portion of a portable electronic device.

The tubes of FIG. 1 are organized to deliver and evacuate fluid, respectively, from the hot surface 15 as indicated by arrows 17 and 18, respectively. The fluid is circulated from a reservoir or plenum chamber 19 via a pump not shown. The fluid is maintained at a pressure to ensure that a supracritical state is maintained and that no change in phase occurs during operation. Accordingly, the fluid is moved at a high rate and at a preselected pressure to ensure that no change in phase occurs. Consequently, a closed system is necessary and a container is represented by broken lines 20 to represent such a container.

A practical arrangement of the thermal management system schematically shown in FIG. 1, comprises a large array of tubes arranged in a fluid delivery array and in a fluid evacuation array respectively. The ends of the tubes of both arrays are contained in a sealed arrangement with the surface which generates the unwanted heat.

Figure 2:
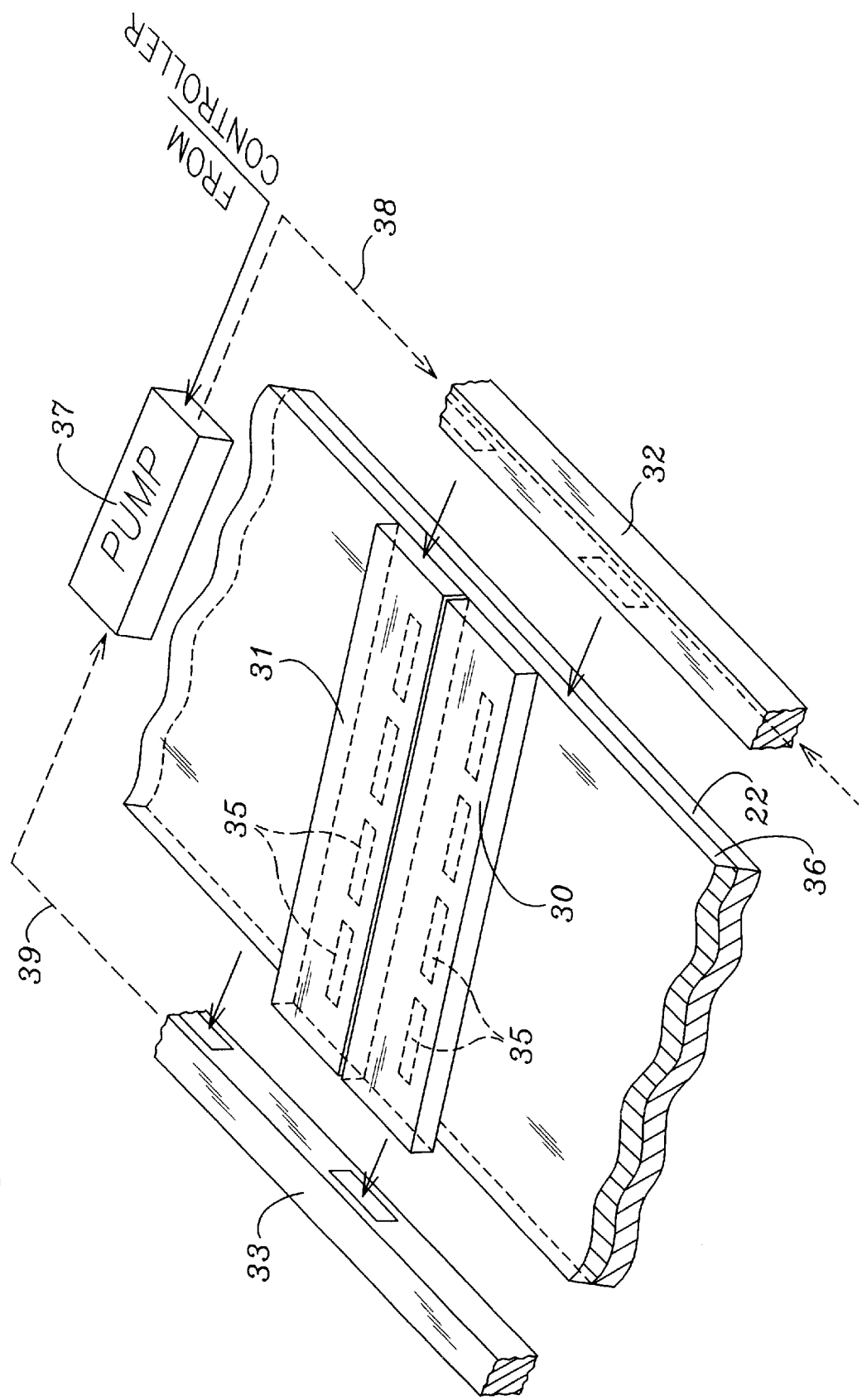
FIG. 2 is an exploded view of a portion of a system embodying the principles discussed in connection with FIG. 1 and adapted for removal of heat from an integrated semiconductor chip.

FIG. 2 illustrates a portion of one practical thermal management system in accordance with the principles of this invention. FIG. 2 shows a hot surface 22 which may be taken to comprise an integrated circuit chip.

The fluid circulating system of FIG. 2 comprises two sets 30 and 31 of horizontally arranged conduits connected to manifolds 33 and 32 respectively. The two sets of conduits (or tubes) are arranged like the teeth of two interleaved combs sealed against one another with the manifolds forming the backbones of the combs.

Each tube can be seen to have openings 35 facing downwards as viewed with the openings (35) in tubes 30 (connected to manifold 33) being in close proximity to the openings (35) in tubes 31 connected to manifold 32. Fluid is pumped via manifold 32 into tubes 30 under high pressure by pump 37 (under the control of a controller not shown) and evacuated from tubes 31 via manifold 33 as indicated by arrows 38 and 39 respectively. The top surfaces of the tubes (30 and 31) as viewed are sealed and the tube sets are sealed against surface 22 to form a sealed fluid delivery system.

It is important, in accordance with the principles of this invention for the fluid to have a short dwell time at the hot surface and for the system to be maintained at a high pressure to ensure that a supracritical state be maintained for the fluid and that a sufficient flow be maintained so that cool fluid is always maintained at the heat generating surface. The short dwell time is maintained by having openings 35 in the exhaust portion (i.e. connected to manifold 33) closely spaced with respect to the openings in the tubes connected to manifold 32.

Tubes 30 are conveniently of rectangular cross section and apertures 35 are formed in the underside surfaces of each of tubes 30 and 31 as viewed in FIG. 2. These tubes extend from manifold 32 such that fluid under pressure in manifold 32 flows downwards through apertures 35 into a sealed pan 36 formed partially by 22.

The apertures in tubes 31 are offset but closely spaced apart from the apertures in tubes 30 such that they are associated with corresponding apertures in tubes 30. Consequently, fluid forced downwards in the apertures of tubes 31 is captured by the associated apertures in tubes 30. The fluid, so captured, is exhausted via manifold 33 for cooling and recirculation. The arrangement of FIG. 2 thus can be seen to constitute a practical arrangement embodying the principles discussed in connection with FIG. 1.

The close proximity of supply and exhaust apertures and the pressure under which fluid is circulated ensures that a change of phase is avoided and the supracritical state is maintained.

It is advantageous to fill the pan (formed with 22) with a porous heat sponge such as POCOFOAM™ or sintered graphite. The pan typically is sealed against the heat generating surface. Thus, the porous material is in direct contact with the heat generating surface. The use of the porous heat sponge allows for a lower pressure and a longer dwell time to be used and still maintain a supracritical state for the fluid.

Figure 3:
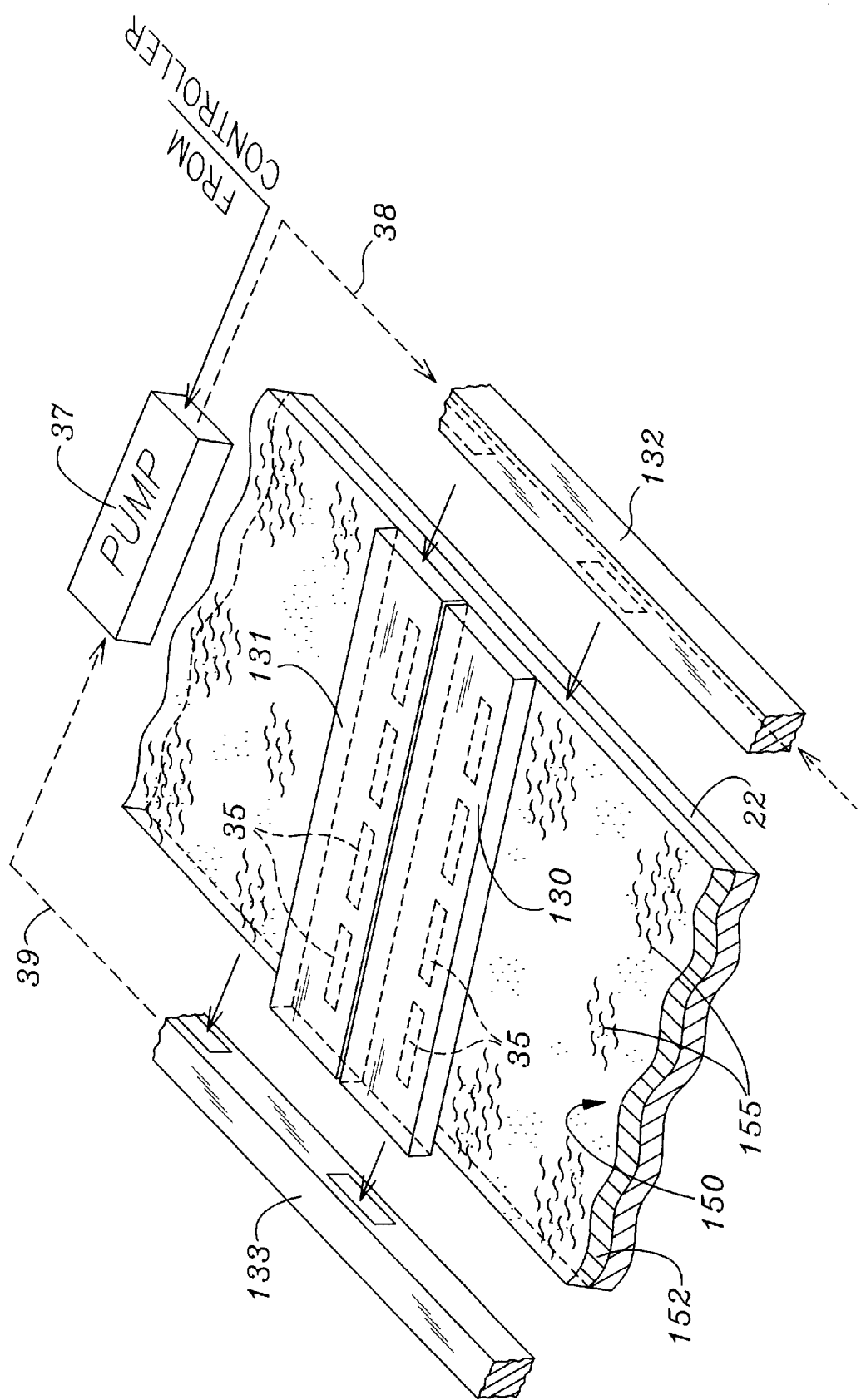
FIG. 3 is an exploded view of a portion of a system as shown in FIG. 2 but including POCOFOAM™ or sintered graphite.

FIG. 3 shows the system of FIG. 2 with representative tubes 131 and 130 for accepting and delivering fluid from and to manifolds 132 and 133 respectively. A hot surface 150 defines the bottom of the trough formed by pan 152. The trough is shown filled with POCOFOAM™ or sintered graphite represented at 155.

The arrangements of FIGS. 2 and 3 are operative to remove heat from a heat-generating surface into a tube or conduit represented by dashed line 39 in the figures. It is advantageous to couple a cooler to conduit 39 to reduce the temperature of the fluid being returned to pump 37. An adaptation of the well known Peltier Cooler is useful to this end.

U.S. Pat. No. 6,164,076 issued Dec. 26, 2000 shows a prior art arrangement of a thermoelectric cooling assembly comprising a cascaded Peltier Cooler including first and second Peltier stages separated by a thermal space transformer. The thermal space transformer comprises a laminate structure which includes a dielectric substrate with a diamond coating. The diamond coating is in contact with a first stage of the cascaded arrangement and the dielectric is in contact with the second stage.

The first stage of the cascaded Peltier Cooler is in contact with the heat generating surface and the second stage is larger in area than the first stage in accordance with well understood principles.

Figure 4:
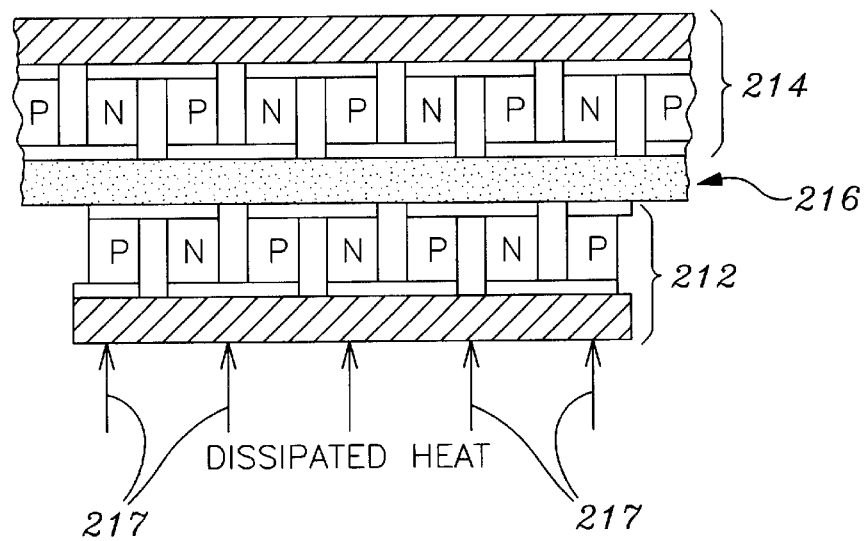
FIGS. 4 and 5 are schematic views of a thermoelectric cooler useful with the system as shown in FIG. 2 or 3.

FIG. 4 is a representation of a two stage cascaded Peltier Cooler. Additional stages may be employed with added stages having increased surface areas and being spaced apart from other stages by a thermal space transformer. FIG. 4, specifically shows first and second stages 212 and 214 separated by a thermal space transformer 216. The cooler is positioned so that heat impacts the cooler from below, as viewed, as represented by the upward-directed arrows 217 in FIG. 4. The P and N-type orientation of the PN junctions are indicated by the P and N notation in FIG. 4 in accordance with well accepted principles.

Figure 5:
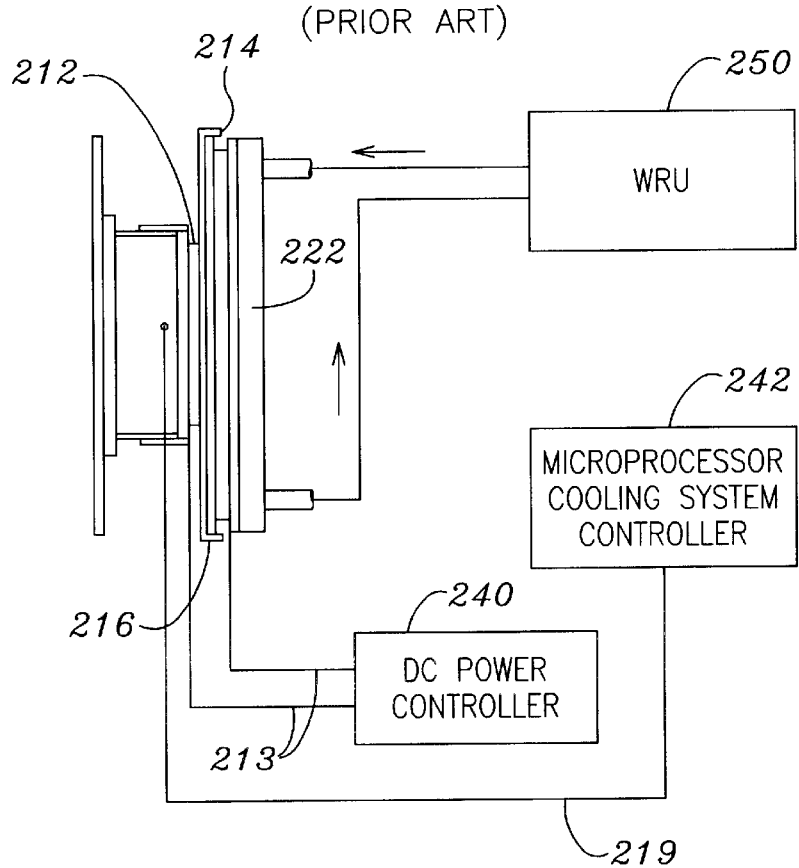

FIG. 5 is a block diagram for the control system of the cooler of FIG. 4. The system includes a DC power controller 240, a microprocessor cooling system controller 242 and a modular refrigeration unit (MRU) 250. Controller 242 is connected to an electronic module by wire 219. DC power is provided to the thermoelectric couples via power lines 213.

In the prior art arrangement of FIG. 5 the hot side of stage 214 is cooled by a cold plate 222. The heat is rejected to the environment via MRU 250.

In accordance with the principles of this invention, the stages of a cascaded thermoelectric cooler (Peltier) are formed with a tubular geometry, where the stages are nested within one another. The spacings between stages and the enclosing areas of each of the succession of stages is determined by the diameter of each stage. By forming the cascaded arrangement as a nested set of tubes, the cooler can be placed about a fluid-conducting conduit such as conduit 39 of FIG. 2 or 3.

Figure 6:
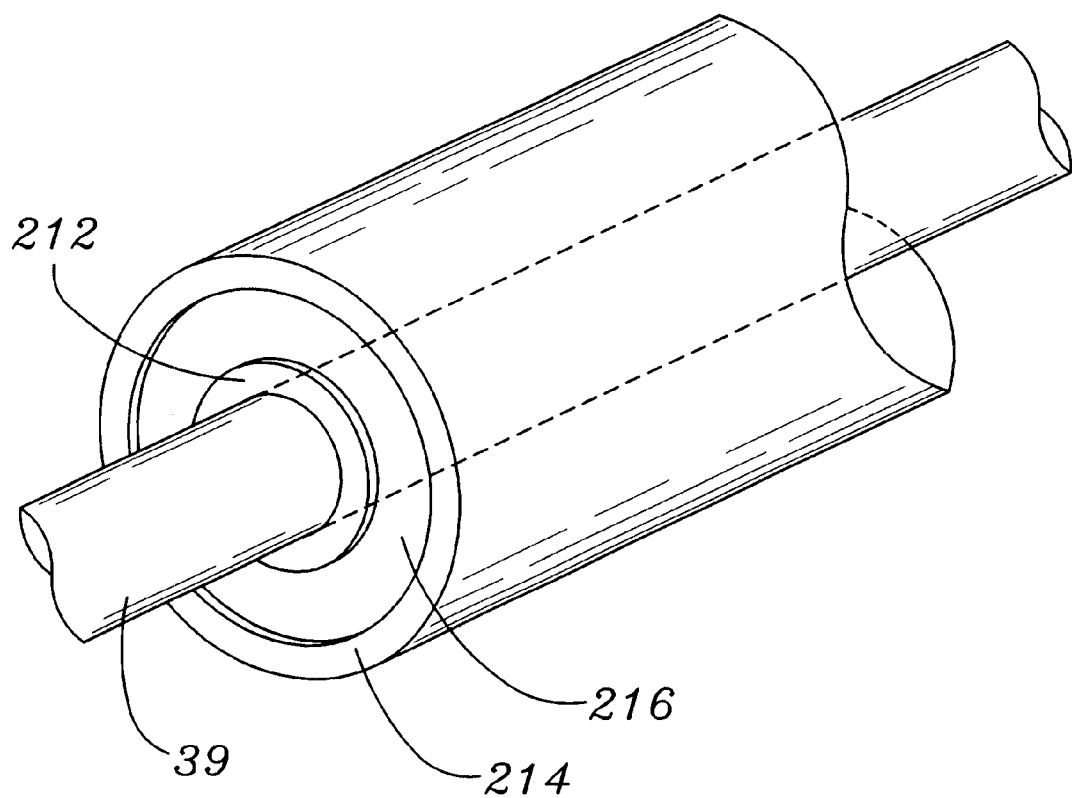
FIG. 6 is a schematic end view of an alternative thermoelectric cooler for use in the system of FIG. 2 or 3 in accordance with the principles of this invention.

FIG. 6 illustrates a cooler comprising a set of nested tubes operative essentially as set forth in the above-identified patent. Like numerical designation are used for corresponding elements of FIGS. 4 and 6 for ease of comparison. The essential difference between the coolers shown in the two figures is the geometry of the nested stages.

Present art for both linearly stacked and for nested Peltier devices can be extended by application of the teachings of this invention by incorporating between layers of the Peltier device a spreader using a supracritical working fluid. In the arrangement of FIG. 4, for example, the requisite transport of heat is provided by a device which is in contact with the heat rejection end of the Peltier device. This arrangement allows supracritical working fluid to contact this heated surface which is in contact with the heat uptake surface of the successive Peltier stages. This arrangement allows supracritical working fluid to contact this surface which is at a lower temperature than the working fluid and thereby operative to remove heat from the working fluid. This extension of the present art as shown in FIG. 6 allows for optimization of the heat transfer capability of linearly stacked Peltier devices to occur by a dominantly convective heat transfer mechanism which has the advantage of decreasing the load and size requirements of subsequent Peltier stages since a heat transfer pathway, the dominant mode of heat movement of which is convection, offers the ability to carry more heat than the identical pathway for which conduction is the dominant mode of heat movement.

In the prior art arrangement shown in FIG. 6, the requisite increasing areas of successive layers of a Peltier stack are provided by a set of cylindrical or tube-shaped Peltier coolers with the diameters of the tubes being chosen to provide the appropriate increasing areas. The spacings between successive layers may be filled with sintered graphite or sintered porous material or supracritical working fluid or any combination of these or other materials which would assist in the transport of heat from a surface to another surface of lower temperature. For illustrative purposes, the ratio spacing between successive radically arranged layers is on the order of 1 to 3 where, for a cooling core arrangement, the heat producing surface is one third the distance from the center of the core than the cooler heat uptake surface. The exact relation of the radially arranged stages varies with such parameters as the type of thermoelectric material and its figure of merit, target temperatures, thermal load, and voltage and current characteristics of the thermoelectric device.

A main advantage of this radial arrangement of Peltier devices is that it is already geometrically optimized for the transfer of heat from the higher temperature inner surface and its capture by a lower temperature outer surface because nearly all heat intercepts the walls which completely encircle each layer. This radial arrangement thereby overcomes one of the main limitations of the current art linear stacked arrangement of Peltier devices used to achieve low temperatures which is the requirement that heat from the higher temperature surface must diffuse through conductive pathways that increasingly inefficient as the size of the lower temperature surface increases. This inefficient geometry of the stacked linear arrangement has the effect of requiring subsequent layers to have an areal extent significantly larger than subsequent layers of an equivalent radial arrangement of Peltier devices delivering the same cooling effect.

A recitation of the dimensions of either of the above-disclosed systems herein is provided to enable the reader to realize the small size of the thermal management system of FIG. 2 or FIG. 3 herein as well as the close spacings between fluid delivery openings and fluid exhaust openings: Specifically each fluid delivery opening has illustrative dimensions 5 to 10 mm in length×1 to 0.05 mm in gap size×5 to 10 mm in width. The fluid delivery tube is continuous and is approximately 1 to 2 mm from a fluid exhaust tube. The fluid delivery and exhaust tubes are staggered and each fluid delivery tube end (opening) is 2 to 3 mm from the next fluid delivery tube end. Likewise for the fluid exhaust tubes. The system illustrated is operative to remove 50 to 100 Watts of thermal energy and is capable of maintaining, at a preset acceptable temperature, a chip generating, for example, 500,000 to 1,000,000 Watts per square meter thermal heat flux—typical for high density semiconductor integrated circuit chips. The system also is capable of being configured for much higher heat flux expected to be generated by future generations of semiconductor devices.

It is advantageous to fill the trough or pan formed by 22 with a porous sponge such as POCOFOAM™ or sintered graphite. The pan typically is sealed against the heat generating surface. Thus the porous material is in direct contact with the heat generating surface. The use of porous sponge allows a shorter dwell time since the fluid velocity is increased compared to the velocity of the fluid if the porous material was not present. The increase in velocity is advantageous since heat transfer is enhanced. Further, due to the porous structure of the flow channel better mixing is realized which lessens the likelihood of fluid stratification within the flow channel. For example, the use of sintered graphite permits a dwell time 2 to 4 milliseconds under typical operating conditions. With $CO_2$ the operating pressure would be above the critical pressure of 7.4 Mpa (1071 psia). Flow rates and the porous structure's permeability could be controlled so as to allow the $CO_2$ to either remain above its critical pressure or go below thereby allowing for a cooling effect should an interface develop which allows the passage of liquid to vapor. Maintaining the pressure above the critical pressure of the working fluid, the system illustrated would be capable of removing 50 to 100 Watts of thermal energy and is capable of maintaining at a preset acceptable temperature, a chip generating 500,000 to 1,000,000 Watts per square meter.

In the arrangement of FIGS. 4 and 5 the requisite increasing areas of successive layers of a Peltier stack are provided by a set of cylindrical or tube-shaped Peltier coolers with the diameters of the tubes being chosen to provide the appropriate areas. The spacings between the successive layers may be filled with sintered graphite or the like.

The principles of this invention may be adapted for use with semiconductor lasers or laser stacks by positioning a tube operative to maintain a supracritical fluid state close to the lasing facets where the tube and the fluid have compatible optical properties.

U.S. Pat. No. 5,959,351 issued Sep. 28, 1978 discloses a cooling system for semiconductor devices which uses an array of fluid input ports with associated fluid exhaust ports. But, the system disclosed utilizes relatively large amounts of fluid and employs a means for encouraging boiling of the fluid. Such a system also is characterized by vapor lock which limits the effectiveness for heat removal. The use of tiny amounts of supracritical fluid at a sufficiently fast flow rate so that cooling fluid is always present at the heat-generating source ensures that the heat removal necessary for the mass heat flux generated by the new generations of semiconductor chips occurs.

The temperature of the supracritical fluid can be maintained at a preset point for removal of known or anticipated levels of mass heat flux generated by a chip. Thus, thermal runaway can be prevented by the design of the cooling system to the rate of flow of the fluid so long as a supracritical state is maintained.

Any technique for providing supracritical fluid may be used in accordance with this invention. U.S. Pat. No. 6,124,632 issued Sep. 26, 2000 describes one such technique. Many others are known in the art. It is the provision of such a fluid and the manner in which that fluid is applied to the minute heat sources presented by, for example, semiconductor chips, are at the core of the present invention.

What has been described are merely illustrative embodiments of the inventions. Modifications and variations thereof can be devised by those skilled in the art within the spirit and scope of the invention as encompassed by the following claims. For example, the tubes (30 and 31 of FIG. 2) may have the bottom surfaces thereof entirely open instead of having a plurality of apertures 35 there. A short dwell time is still provided by having a plurality of fluid delivery tubes closely spaced apart from associated fluid exhaust tubes.

What is claimed is:

1. A system for heat removal from a solid state chip having a first surface, said system including first means for circulating against said surface a fluid at a pressure and for a sufficiently short dwell time to remove heat from said surface without causing a change of phase of said fluid in a manner to maintain said fluid in a supracritical state.

2. A system for heat removal from a source of heat such as a solid state chip having a first surface, said system including first means for circulating against said surface a supracritical fluid at a pressure and for a sufficiently short dwell time to remove heat from said surface without causing a change of phase of said fluid.

3. A system as in claim 2 wherein said first means comprises first and second manifolds, said first and second manifolds being connected to first and second sets of conduits for fluid delivery and for fluid exhaust respectively; each conduit of said first set of conduits having a first end communicating with said first manifold, each conduit of said second set of conduits having a first end communicating with said second manifold, each of said conduits of both of said first and second sets of conduits having a closed second end, said first and second sets of conduits being interleaved such that corresponding conduits in said first and second sets are in close proximity with one another.

4. A system as in claim 3 wherein said first and second sets of conduits are sealed against said first surface in a manner to provide a fluid path there between.

5. A system as in claim 4 wherein each conduit of said first and second sets of conduits include openings to said fluid path.

6. A system as in claim 5 wherein said means also includes a pump for moving said fluid from said first to said second manifold in a manner to avoid a change of phase of said fluid in said fluid path.

7. A system as in claim 3 wherein said conduits of said first and second sets comprise interleaved linear arrangements of holes in a rigid planar member.

8. A system as in claim 3 wherein each conduit of each of said first and second sets of conduits has a cross sectional area and the cross sectional areas of said first set are smaller than the cross sectional areas of the conduits of said second set.

9. A system as in claim 8 wherein the conduits of said first and second sets are tubular having first and second diameters, the diameter of the conduits of said first set being smaller than the diameters of the conduits of said second set.

10. A system as in claim 3 also including a thermoelectric cooler coupled to said conduits between said first and second manifolds, said cooler comprising a nesting set of concentric tubes of thermoelectric material arranged about said second manifold.

11. A system as in claim 10 wherein the tubes of said set are spaced apart from one another a distance to be efficient at removing the heat generated by the adjacent, smaller diameter tube, the spacing between the tubes of said nesting set being filled with porous material, said system also including second means for circulating fluid through said porous material.

12. A system as in claim 11 wherein said porous material comprises sintered graphite.

13. A system as in claim 11 wherein said porous material comprises sintered diamond.

14. A system as in claim 10 wherein said second means comprises means for maintaining said fluid in a supracritical state.

15. A system as in claim 1 wherein said first means comprises first and second manifolds, said manifolds being connected to first and second sets of conduits for fluid delivery and for fluid exhaust respectively, each conduit of said first set of conduits having a first end communicating with said first manifold, each conduit of said second set of conduits having a first end communicating with said second manifold, each of said conduits of both of said first and second sets of conduits having a closed second end, said first and second sets of conduits being interleaved such that corresponding conduits in said first and second sets are in close proximity with one another.

16. A system as in claim 15 wherein said first and second sets of conduits are sealed against said first surface in a manner to provide a fluid path there between.

17. A system as in claim 16 wherein each conduit of said first and second sets of conduits include openings to said fluid path.

18. A system as in claim 15 wherein said conduits of said first and second sets comprise interleaved linear arrangements of holes in a rigid planar member.

* * * * *